United States Patent [19]

Doormann et al.

[11] Patent Number: 4,778,580

[45] Date of Patent: Oct. 18, 1988

[54] METHOD OF MANUFACTURING STRUCTURED EPITAXIAL LAYERS ON A SUBSTRATE

[75] Inventors: Volker Doormann; Jens-Peter Krumme, both of Hamburg, Fed. Rep. of Germany

[73] Assignee: U.S. Philips Corporation, New York, N.Y.

[21] Appl. No.: 9,445

[22] Filed: Feb. 2, 1987

[30] Foreign Application Priority Data

Feb. 22, 1986 [DE] Fed. Rep. of Germany ....... 3605793

[51] Int. Cl.$^4$ .............................................. C23C 14/34
[52] U.S. Cl. ................................. 204/192.2; 156/628; 204/192.15; 204/192.3; 204/192.35
[58] Field of Search ............ 204/192.15, 192.2, 192.3, 204/192.35; 428/900; 156/628, 632

[56] References Cited

U.S. PATENT DOCUMENTS

| | | | |
|---|---|---|---|
| 4,314,894 | 2/1982 | Schmelzer et al. | 204/192.2 X |
| 4,347,112 | 8/1982 | Togami | 204/192.2 |
| 4,608,142 | 8/1986 | Gomi et al. | 204/192.2 |
| 4,684,454 | 8/1987 | Gardner | 204/192.2 |

*Primary Examiner*—John F. Niebling
*Assistant Examiner*—Nam X. Nguyen
*Attorney, Agent, or Firm*—Paul R. Miller

[57] ABSTRACT

A method of manufacturing structured epitaxial layers is discribed having monocrystalline layer regions adjacent to layer regions of a different order situated on a monocrystalline substrate whose crystal lattice is disturbed in locally bounded surface regions. A lattice disorder is formed with, the layers being manufactured by means of RF cathode sputtering (sputter epitaxy) in an inert gas plasma, and making use of a target containing the elements which contribute in the form of phases with an almost identical sputtering rate to the formation of the layer.

10 Claims, No Drawings

METHOD OF MANUFACTURING STRUCTURED EPITAXIAL LAYERS ON A SUBSTRATE

The invention relates to a method of manufacturing structured epitaxial layers, whereby monocrystalline layer regions are situated adjacent to layer regions of a different order on a monocrystalline substrate whose crystal lattice is disturbed in locally bounded surface regions, thereby forming a lattice disorder.

The invention further relates to the use of layers which are manufactured according to such a method.

In the manufacture of, for example, electronic components, such as semiconductor components, or, for example, magneto-optical components, such as magneto-optical light-switching elements, cylindrical domain memories, or magneto-optical isolators, monocrystalline layers are utilized which are grown epitaxially on monocrystalline substrates and which must be structured according to their application before they are subjected to further processing steps. Structuring is to be understood to mean to local subdivision of the monocrystalline layer, in which process monocrystalline islands which are present separately on the continuous monocrystalline substrate are etched from the epitaxial layer, for example, by means of a wet chemical etching process.

In the structuring process of monocrystalline layers by means of a wet chemical etching processing in which a part of the monocrystalline layer initially covering the entire substrate is removed, separate monocrystalline regions are formed on the continuous substrate. It may prove to be a disadvantage to subsequent process steps that the previously flat surface of the monocrystalline layer is no longer flat due to the structuring operation by means of the wet chemical etching process. Structuring of layers manufactured by, for example, liquid phase epitaxy has been tried (Jap. J. Appl. Phys. 16 (1977), No, 2, pages 373 to 374) by locally disturbing the substrate through an energetic ion implantation before the epitaxial layer is provided, so that with the epitaxial layer deposition a pattern is formed from areas, i.e. monocrystalline areas (a layer on undisturbed substrate regions) in a polycrystalline environment (a layer on disturbed substrate regions). The energy of the ions to be implanted, which is of the order of $10^4$ eV, is to be kept so low that all ions of the mask are still absorbed; however, it should be selected to be so high that the depth of the imperfections in the substrate caused by implanted ions suffices to ensure that the energy is not entirely consumed in the initial etching process which takes place at the beginning of the liquidphase epitaxy. These requirements limit the use of mask technology and, above all, entail a substantial technical expenditure because the use of an ion-implantation arrangement is necessary. Around the monocrystalline epitaxial regions polycrystalline border zones are formed on the disturbed regions of the substrate, which may be undesired; for example, in the case of ferrimagnetic garnet films which are deposited through liquid phase epitaxy these polycrystalline regions are also magnetic, which may be disadvantageous, for example, for a perfect magneto-optical switching process in light switching elements. Moreover, in the case of components which are based on magnetic monocrystalline layers, which components are surrounded by polycrystalline border zones, it is disadvantageous that the orientation and formation of magnetic walls are adversely affected. Magnetic walls are retained at the relatively rough interfaces between the polycrystalline and monocrystalline regions. Also at the rough interface light scattering occurs.

It is an object of the invention to so improve the method mentioned in the opening paragraph that structured, epitaxial layers having quasi planar surfaces can be manufactured with a smaller expenditure of equipment and with the layers having smoth interfaces between the epitaxial monocrystalline regions and the surrounding disordered regions.

This object is achieved in accordance with the invention, in that the layers are manufactured by means of RF cathode sputtering (sputter epitaxy) in an inert gas plasma by making use of a target which contains the elements contributing in the form of phases with an almost identical sputtering rate, to the formation of the layers.

The invention is based on the insight that sputter epitaxy of, for example, complex layers which consist of elements having a very different sputtering rate, can be carried out when monocrystalline substrates, having well defined undisturbed surfaces and targets having an almost identical sputtering rate of its constituent phases, are used, and when the RF cathode sputtering process is carried out in an inert gas plasma. Preferably a helium-group gas plasma, particularly an argon plasma is used.

In accordance with an advantageous embodiment of the method in accordance with the invention, the substrate is heated to a temperature which is higher than the temperature at which epitaxial monocrystalline layer growth on substrate regions having an undisturbed crystal lattice starts, and which is lower than the temperature at which polycrystalline layer growth on substrate regions having a disturbed crystal lattice starts.

In a sputter epitaxy process the substrate temperature during the deposition process plays a part since a higher substrate temperature favours a spontaneous crystallisation of the deposited layer, in which connection it was found that epitaxial growth on substrate regions having an undisturbed crystal lattice starts at lower temperature than polycrystalline growth on substrate regions having a disturbed crystal lattice. In other words, $T_{epitaxial\ growth} < T_{polycrystalline\ growth}$. Hereinafter, these temperatures will be denoted as $T_{epi}$ and $T_{poly}$, respectively. When substrates are used whose crystal lattices were locally converted to a condition of disorder, for example, by an ion bombardment, an amorphous or a polycrystalline layer is deposited, depending upon the substrate temperature, on the disturbed substrate regions by the cathode sputtering process, whereas on the undisturbed, monocrystalline regions the material deposited by cathode sputtering grows as a monocrystalline layer. In other words, the substrate temperature T for manufacture by means of sputter epitaxy of a structured layer having monocrystalline and, next thereto, amorphous layer regions must be selected so that: $T_{epi} < T_{substrate} < T_{poly}$.

In a preferred embodiment of the method according to the invention, a structured epitaxial ferrimagnetic garnet layer is deposited on a monocrystalline substrate whose crystal lattice is disturbed in locally bounded surface regions, thereby forming a lattice disorder, whereby the layer is deposited by means of RF cathode sputtering in an inert gas plasma, making use of a target which contains the elements contributing, in the form of phases with an almost identical sputtering rate, to the formation of the layer, whereby the substrate is heated to a temperature of about 450°–520° C., and whereby on substrate regions having an undisturbed crystal lattice, a monocrystalline region of the ferrimagnetic layer is grown, and on the substrate regions with a disturbed crystal lattice, an amorphous region of the ferrimagnetic layer is grown.

It has been found that on a monocrystalline garnet substrate, a monocrystalline ferrimagnetic garnet layer is grown when the substrate is heated to about a temperature of 450° C. or higher.

When a ferrimagnetic garnet layer is deposited on a substrate which is not monocrystalline in, at least, near-surface regions, such as, for example, a disturbed monocrystalline, a polycrystalline or an amorphouse substrate, the ferrimagnetic layer is amorphous to X-rays, amorphous at a substrate temperature below 520° C., and is polycrystalline at higher substrate temperatures.

In general, the substrate temperature to be selected depends upon the desired composition of the layers to be formed and must be established empirically.

In a further preferred embodiment the amorphous layer region is subjected to a chemical etching process to produce a high-resolution groove profile with the obtained profile surface optionally being provided with a further structured epitaxial layer by means of a RF cathode sputtering process so as to form a multi-layer structure with a desired surface profile.

It has been found that the chemical etching rate, whereby etching is performed for example in phosphoric acid at 150° C., is about 7 times faster for amorphous layer regions compared to monocrystalline layer regions, so that high resolution, deep groove profiles can be obtained by preferential removal of amorphous material.

In accordance with advantageous embodiments of the inventive method, the lattice structure of the substrate is disturbed to a depth of several atom layers by an ion bombardment by means of a plasma, suitably a helium-group gas plasma.

In a sputter-etching process (ion bombardment from the plasma) at relatively low RF voltages and relatively low plasma pressures the lattice structure of a monocrystalline substrate which is to be coated epitaxially by means of cathode sputtering may become disturbed in near-surface regions of a depth of only a few atom layers, such that, depending on the substrate temperature, instead of an epitaxial monocrystalline layer a layer of different order, preferably an amorphous layer, is grown in the disturbed regions. On the undisturbed regions of the substrate an epitaxial monocrystalline layer is grown. This has the advantage that the same arrangement can be used during the entire process and that a lattice imperfection is obtained with a depth of only a few atom layers.

In accordance with a further advantageous embodiment of the invention, structured monocrystalline ferrimagnetic garnet films of the general formula $(A,B)_3 (A,B)_5O_{12}$ are manufactured, where A=at least one rare earth metal, Bi, Ca and/or Mg and B=Ga, Al, Fe, Co, Ni, Mn, Ru, Ir, In, Sc and/or Zr. Unlike, for example, liquid phase epitaxy processes the sputter epitaxy process takes place outside the thermochemical equilibrium. Consequently, the manufacture of, for example, garnet films in non-equilibrium compositions, is possible without a foreign phase. Preferably, according to the inventive method, single-phase ferrimagnetic garnet films having the following compositions are manufactured 1. $Gd_{1.97}Bi_{1.04}Fe_{4.51}Ga_{0.22}Al_{0.26}O_{12}$ and
2. $Gd_{1.90}Bi_{1.45}Fe_{4.09}Al_{0.34}Ga_{0.22}O_{12}$.

In accordance with an advantageous further embodiment of the invention, a magnetron is used as a target electrode to which the RF power necessary for the sputtering process is applied. The use of a magnetron results in a concentration of the plasma near the target, and consequently, in a drastic reduction of the ion bombardment of the growing layer, so that, for example, no back-sputtering effects which adversely affect the epitaxial growth will occur at the layer. The use of a magnetron has the additional advantage that, in comparison with methods which employ RF cathode sputtering devices in a diode arrangement, the distance between the target and the substrate can be optimised, i.e. the lowest possible plasma density in the vicinity of the substrate in combination with the highest possible deposition rate. For optimal confinement of the plasma to the target surface, the mangetisation M of the target preferably should be small such as below 25 G, and the magnetron field should be strong by using for example SmCo magnets.

In a preferred embodiment of the inventive method a (111) or (110) oriented non-magnetic, single crystal garnet disc is used as a substrate.

Particularly useful are discs of (111) or (110)-oriented, calcium magnesium zirconium-substituted gadolinium gallium monocrystal garnet having the formula $(Gd, Ca)_3(Ga, Mg, Zr)_5O_{12}$.

The invention further relates to the use of a structured epitaxial ferrimagnetic garnet layer which is provided on a monocrystalline substrate by the method according to the invention in magneto-optical displays, magneto-optical light switching elements, cylindrical domain memories, and optical waveguide devices.

This use provides important advantages. According to the state of art, the use of magneto-optical ferrimagnetic garnet films on non-magnetic garnet substrates in the above products does mean that the films (layers) must be sub-divided (=structured) by a wet chemical etching process into single and separate magnetooptical islands on the substrate. In order to ensure that the regions always have the same direction of magnetisation, the length of the edges of such magneto-optical islands may in practice not exceed 100 $\mu$m. Such a reproducibly accurate structuring of a layer by means of a wet chemical etching process puts high demands on mask technology, and it is very difficult to avoid, for example, under-etching.

The present method permits the manufacture of, for example, epitaxial islands which are all encapsulated in material of the same chemical composition and similar homogeneity, but of different order than the islands.

The border zones surrounding the epitaxial islands are amorphous and have a smooth surface, the interfaces between the monocrystalline islands and the amorphous border zones being steep and smooth.

A further advantage of the layers manufactured in accordance with the present method is that any further, structured layers can be provided onto a first structured epitaxial layer without any problems regarding the coating of the edges, because despite its structure the first layer is quasi planar. This is an advantage, for example, for the manufacture of integrated semiconductor structures and strip conductors.

A further advantage of the structured epitaxial layers manufactured in accordance with the present method resides in the satisfactory lateral, geometrical resolution of the structures formed with the resolution being of the order of 1 $\mu$m.

A further advantage of the present method is that for the manufacture of structured epitaxial layers a single arrangement can be employed, namely the cathode sputtering device, both for the preparation of the substrate to be coated (ion bombardment) and for the manufacture of the epitaxial layer, which from the point of view of efficiency is important in a manufacturing process.

A further advantage of the present method is that very thin homogeneous epitaxial layers can be manufactured, while, in contrast to the liquid phase epitaxy, no transient layers are formed.

A further advantage of the present method is, for example, that for the manufacture of ferrimagnetic garnet films on a non-magnetic substrate, the requirement of lattice matching of the substrate and the layer is less stringent contrary to liquid phase epitaxy; lattice mismatches of $>1\%$ are acceptable.

RF cathode sputtering can be carried out by means of commercially available RF voltage-operated cathode sputtering devices having a magnetic-field enhanced target electrode (magnetron) with a measuring arrangement for measuring the effective RF voltage both at the target electrode and the substrate electrode having to be provided as an auxiliary arrangement. The magnetron electrode is provided vertically in an ordinary vacuum recipient. The RF power which is necessary for the sputtering process is applied to the plasma through impedancematching elements, the target electrode, and the substrate electrode. The stabilisation of the RF voltage at the target electrode at values smaller than $+1\%$ is obtained via a computer control. The pressure of the plasma gas is also kept constant to $+1\%$ by a computer control. An ordinary RF generator is used as an energy source for the sputtering arrangement, which generator is operated at an output power of 200 W. The operating frequency is 13.56 MHz.

As an exemplary embodiment of the invention a description is given of the manufacture of structured epitaxial bismuth-substituted gadolinium iron garnet layers in which part of the iron is substituted by aluminium and gallium.

In order to produce lattice imperfections in locally bounded regions of substrates, the substrates are first subjected to a wet chemical etching process in which they are etched in phosphoric acid at an elevated temperature of, for example, 150° C., for a period of time of for and centrifuged. Next, the substrates are baked out for about 30 min. at a temperature which corresponds to the subsequent deposition temperature. Subsequently, the portions of the substrates whose lattice structure is not to be disturbed are provided with a photolithographic mask. The substrate thus prepared is positioned on the target electrode of the cathode sputtering device which also is to be used for the subsequent cathode sputtering process, and is subjected to an ion bombardment for which an argon plasma is used with the pressure of the argon atmosphere being 0.1-1 Pa, such as 0.2 Pa, and the ion energy being $<30$ eV such as $10^2$ eV. The ion bombardment is carried out for 10 minutes, thereby so disturbing the first atom layers of the substrate lattice that in the following epitaxial coating process there is no monocrystalline layer growth in these regions. In the disturbed substrate regions the layers are grown, preferably, amorphously. The crystal lattice of the substrates which is disturbed by ion bombardment cannot be annealed at temperatures below 700° C. In the same way there will be no recrystallisation of amorphous iron-garnet layers at temperatures $<700°$ C. Consequently, the condition of the amorphous layer regions is very stable during the deposition process. After the ion bombardment the substrates are removed from the cathode sputtering device and the photo-resist mask is removed.

Subsequently, the substrates are fixed on the substrate electrode.

A body manufactured by hot-pressing mixed oxides of the elements involved in the formation of the layer is used as a target (cathodic sputtering source) with the body having a diameter of 7.5 cm., a thickness of 4 mm, and a porosity $<10\%$.

For the following examples of embodiments powder mixtures of $BiFeO_3$, $Gd_2Bi_1Fe_5O_{12}$, $Al_2O_3$, $Ga_2O_3$ and $Gd_2O_3$ are sintered in an oxygen atmosphere having a pressure of 1 bar for 6 hours at a temperature $<920°$ C. with the process being conducted so that no free $Bi_2O_3$ remains in the ceramic structure. Free $Bi_2O_3$ must not be present in the target because it will lead to a mechanical disintegration of the surface of the target due to the fact that it has a higher sputtering rate than the other target constituent phases; thanks to the use of mixed oxides a homogenisation of the sputtering rate of all phase constituents of the target is obtained.

EXAMPLE 1

For the manufacture of an epitaxial single-phase garnet layer of the composition $Gd_{1.90}Bi_{1.45}Fe_{4.09}Al_{0.34}Ga_{0.22}O_{12}$ a target having a magnetisation Ms of 13.3 G and of the following composition is used (quantities in % by weight):

$Gd_2O_3$ 33.64
$Bi_2O_3$ 31.80
$Fe_2O_3$ 31.52
$Al_2O_3$ 1.15
$Ga_2O_3$ 1.89

The target body is attached to the target electrode by means of a suitable heat-conducting adhesive (for example epoxy resin filled with silver powder).

In order to conduct away dissipated heat it is efficient, to use, for example, water-cooled target electrodes.

The coating process is conducted so that the sputtering equipment is first evacuated to a pressure of $<10^{-5}$ mbar by means of a vacuum pump. Subsequently, a helium group gas, preferably argon having a pressure of 0.6 Pa, is introduced. The distance between the target and the substrate is 80 mm. The deposition rate is approximately 1 $\mu$m/h. The RF voltage measured at the RF-lead on the rear side of the target electrode is 230 $V_{RMS}$, the substrate potential is floating. The substrate temperature is 480° C.

EXAMPLE 2

For the manufacture of an epitaxial single-phase garnet layer of the composition $Gd_{1.97}Bi_{1.04}Fe_{4.51}Ga_{0.22}Al_{0.26}O_{12}$ a target having a magnetisation Ms of 18 G and of the following composition is used (quantities in % by weight):

$Gd_2O_3$ 36.514
$Bi_2O_3$ 24.122
$Fe_2O_3$ 36.074

Al₂O₃ 1.220
Ga₂O₃ 2.070

As described with respect to example 1, the target body is attached to the target electrode. It is also effective to conduct away dissipated heat by the use of water-cooled target electrodes.

The coating process is carried out as described with respect to example 1, however, the substrate temperature was 535° C.

Before the layers are deposited (typical layer thicknesses are from 1 to 5 μm) the target is pre-etched by sputtering in plasma until the target material thus removed has a constant composition.

In further experiments with the same target the pre-etching time is reduced from approximately 0.5 h to some 10 minutes, until the equilibrium target-potential has stabilized.

After the deposition in the cathode-sputtering device, layers are obtained which are amorphous or X-ray amorphous on the substrate regions with a lattice disorder, and which are monocrystalline on the substrate regions with monocrystalline, undisturbed crystal lattices. The example of the bismuth-substituted iron garnet layers which were manufactured as described above, was used to verify the following properties of the layers structured in accordance with the present method;

The border zone surrounding the epitaxial, i.e. monocrystalline regions is smooth.

The magnetic domains adjoin the amorphous border zones in a suitable manner and without a transitional area, while forming a sharp boundary between paramagnetic and ferrimagnetic layer domains.

The geometrical lateral resolution of the structure obtained in accordance with the present method is of the order of 1 μm.

The structure of the layers obtained is planar.

With regard to the thickness, chemical composition, and surface condition, the amorphous and the monocrystalline layer regions are very homogeneous.

In contrast to the monocrystalline layer regions, the amorphous layer regions do not exhibit spontaneous magnetisation (they are paramagnetic).

Stoichiometrically, the layers obtained are saturated with oxygen, even when they were sputtered in a plasma which did not contain oxygen.

Helium-group gas atoms are introduced in spontaneously crystallised layers in quantities 0.1%.

Etching rate in 150° C. phosphoric acid of the amorphous regions of the layer is 7 times faster than that of the epitaxial, monocrystalline regions and 12 times faster than that of gallium garnet substrates.

What is claimed is:

1. A method of manufacturing structured epitaxial layers comprising
   forming at least one lattice disorder at locally bounded surface regions of a monocrystalline substrate, and
   forming epitaxial layer regions on said substrate by RF cathode sputtering in an inert gas plasma by using a target containing elements contributing to formation of said layer regions, said layer regions being formed in phases with an almost identical sputtering rate.

2. A method according to claim 1, wherein said substrate is heated to a first temperature higher than a second temperature, said second temperature being a temperature where epitaxial monocrystalline layer growth begins on said substrate at regions apart from said lattice disorders, and wherein said first temperature is lower than a third temperature where polycrystalline layer growth starts on said substrate at said surface regions of said lattice disorder.

3. A method according to claim 2, wherein said epitaxial layer regions include at least one structured epitaxial ferrimagnetic garnet layer, wherein said substrate is heated to a temperature ranging from about 450° C. to 520° C., and wherein monocrystalline regions of said ferrimagnetic garnet layer are grown on said regions of said substrate apart from said lattice disorders, and amorphous regions of said ferrimagnetic garnet layers are grown on said regions of said lattice disorders.

4. A method according to claim 3, wherein said amorphous regions are subjected to a chemical etching process to produce a high-resolution groove profile, said high-resolution groove profile being provided with a further structured epitaxial layer by said RF cathode sputtering to form a multi-layered structure with a predetermined surface profile.

5. A method according to claim 3 or claim 4, wherein said monocrystalline regions of said ferrimagnetic garnet layer are formed from the general formula $(A,B)_3(A,B)_5O_{12}$, where A = at least one rare earth metal, Bi, Ca, and/or Mg, and where B = Ga, Al, Fe, Co, Ni, Mn, Ru, Ir, In, Sc, and/or Zr.

6. A method according to claim 5, wherein said regions have a composition corresponding to one of
   (1) $Gd_{1.90}Bi_{1.45}Ge_{4.09}Al_{0.34}Ga_{0.22}O_{12}$, or
   (2) $Gd_{1.97}Bi_{1.04}Fe_{4.51}Ga_{0.22}Al_{0.26}O_{12}$.

7. A method according to claim 1, wherein said lattice disorders are locally formed to a depth of several atom layers by an ion bombardment of said substrate with said plasma.

8. A method according to claim 1 or claim 2 or claim 3 or claim 7, wherein said target is a magnetron electrode, and wherein RF power necessary for said sputtering is applied to said magnetron electrode.

9. A method according to claim 1 or claim 2 or claim 3 or claim 7, wherein said substrate is a (111) or (110) oriented, non-magnetic, single crystal garnet disc.

10. A method according to claim 9, wherein said substrate is a calcium magnesium zirconium substituted gadolinium gallium garnet having the formula $(Gd, Ca)_3(Ga, Mg, Zr)_5O_{12}$.

* * * * *